US009571054B2

(12) United States Patent
DiNunzio

(10) Patent No.: US 9,571,054 B2
(45) Date of Patent: Feb. 14, 2017

(54) SYSTEMS AND METHODS FOR DYNAMICALLY ADJUSTING VOLUME BASED ON MEDIA CONTENT

(71) Applicant: United Video Properties, Inc., Santa Clara, CA (US)

(72) Inventor: James DiNunzio, Burbank, CA (US)

(73) Assignee: Rovi Guides, Inc., San Carlos, CA (US)

( * ) Notice: Subject to any disclaimer, the term of this patent is extended or adjusted under 35 U.S.C. 154(b) by 411 days.

(21) Appl. No.: 13/780,732

(22) Filed: Feb. 28, 2013

(65) Prior Publication Data
US 2014/0240595 A1    Aug. 28, 2014

(51) Int. Cl.
*H03G 3/20* (2006.01)
*H03G 3/30* (2006.01)
*H03G 3/04* (2006.01)

(52) U.S. Cl.
CPC .............. *H03G 3/3005* (2013.01); *H03G 3/04* (2013.01)

(58) Field of Classification Search
CPC ... H04R 2430/00; H04R 2430/01; H03G 3/20; H03G 3/24; H03G 3/32; H03G 11/00; H03G 11/08; H03G 2201/30
USPC ................................... 381/104, 105, 107, 57
See application file for complete search history.

(56) References Cited

U.S. PATENT DOCUMENTS

| 7,110,558 | B1 * | 9/2006 | Elliott | ............................ 381/105 |
| 8,135,147 | B2 | 3/2012 | Hong | |
| 2007/0177743 | A1 * | 8/2007 | Mertens | ................. H04N 5/607 381/107 |
| 2008/0144860 | A1 * | 6/2008 | Haller | ....................... H03G 3/10 381/109 |
| 2009/0245536 | A1 * | 10/2009 | Felix | .................... H03G 3/3005 381/104 |
| 2014/0140537 | A1 * | 5/2014 | Soulodre | ........................ 381/104 |

FOREIGN PATENT DOCUMENTS

| EP | 1 727 391 | 11/2006 |
| EP | 2 166 668 | 3/2010 |
| EP | 2 391 004 | 11/2011 |
| WO | WO 2005/109635 | 11/2005 |
| WO | WO 2008/073487 | 6/2008 |

* cited by examiner

*Primary Examiner* — Ahmad F Matar
*Assistant Examiner* — Sabrina Diaz
(74) *Attorney, Agent, or Firm* — Ropes & Gray LLP

(57) ABSTRACT

Systems and methods for dynamically adjusting a volume are provided. A presentation of a media asset is generated with a user equipment device at a first volume level. A user request to adjust a volume level of the media asset is received. Subject matter of the media asset currently being presented is determined. A volume adjustment rate is automatically set based on the determined subject matter. The volume level of the media asset is gradually adjusted from the first volume level to a second volume level at a rate corresponding to the volume adjustment rate based on the user request.

20 Claims, 5 Drawing Sheets

600

Target Volume Levels

610 — <SUBJECT - MATTER1>
620 —    <CATEGORY> Action </CATEGORY>
630 —    <target-volume> 70% </target-volume>
640 —    <threshold> 20% </threshold>
</SUBJECT - MATTER1>

<SUBJECT - MATTER2>
   <TYPE> COMMERCIAL </TYPE>
   <target-volume> 10% </target-volume>
   <threshold> 40% </threshold>
</SUBJECT - MATTER2>

<SUBJECT - MATTER3>
   <TYPE> MOVIE </TYPE>
   <target-volume> 60% </target-volume>
   <threshold> 30% </threshold>
</SUBJECT - MATTER3>

<SUBJECT - MATTER4>
622 —    <TYPE> MUSIC CHANNEL </TYPE>
   <category> easy 1.3t***g </category>
   <target-volume> 20% </target-volume>
   <threshold> 10% </threshold>
</SUBJECT - MATTER4>

SYSTEMS AND METHODS FOR DYNAMICALLY ADJUSTING VOLUME BASED ON MEDIA CONTENT

BACKGROUND

Traditional media systems allow users to manually adjust the volume of a media asset being consumed up or down. Moreover, these systems sometimes set an upper limit which a volume level cannot exceed based on content being consumed. For example, these systems can automatically prevent a commercial or action scene that is presented from exceeding a given volume level. However, the traditional systems fail to consider how fast or slow the user desires to change volume during different media presentations. This deficiency puts the burden on the user to manually adjust the volume at the same rate each time the media changes. Specifically, to reduce the volume during one segment (but not mute the volume) and then increase the volume in another segment of a show, the user has to press a volume up button a same number of times as volume down button to return to the previous volume.

SUMMARY

These and other objects are accomplished in accordance with the principles of the present invention by providing enhanced user equipment configured to provide more efficient navigation on interactive grid displays.

In some embodiments, a presentation of a media asset is generated with a user equipment device at a first volume level. The media asset may be a music asset or a video asset for which sound is being output at a first volume level (e.g., a first decibel level). A user request to adjust a volume level of the media asset is received. The user request may be received from an on-screen selection of a volume up/down key or a remote controller. The user request may include the user pressing a volume key one time or multiple times. In some embodiments, the user request may include the user pressing a volume key for a defined period of time, where the longer the period the greater the amount of adjustment the user desires.

Subject matter of the media asset currently being presented is determined. The subject matter may identify the type of media asset, the source of the media asset, and/or the content of the media asset (e.g., whether the media asset is in a plot or commercial segment). In some embodiments, the subject matter is determined by processing at least one of keywords in closed-caption information received with the media asset and an image currently being displayed. At least one of a database of keywords associated with different subject matters and a database of images associated is cross-referenced with different subject matters to determine the subject matter.

In some embodiments, a database of volume adjustment rates associated with different subject matters may be generated. In some embodiments, the database may be generated based on user inputs being received that assign different subject matters to volume adjustment rates. In some embodiments, volume levels set by a user for different subject matters may be monitored. The database may be automatically populated based on the monitored volume levels. A volume adjustment rate is retrieved from the database based on the subject matter. The retrieved volume adjustment rate may be used to set the current volume adjustment rate for the subject matter being presented.

The volume adjustment rate may determine by how much to adjust a currently set volume level to another volume level in response to receiving a user request based on a volume level. In particular, the volume adjustment rate may indicate a number of volume rate units or chunk sizes to skip. The volume rate units or chunk sizes indicated by the volume adjustment rate specify how many volume levels (e.g., percentage or decibel) to skip over with each request to adjust the volume (e.g., each time the user presses a volume up/down key).

In some embodiments, the subject matter may be cross-referenced with a subject matter database to identify a target volume level for the subject matter. The target volume level may be compared with the current volume level. When the difference between the target volume level and the current volume level exceeds a threshold, the volume adjustment rate may be increased (e.g., by one or more chunk sizes or volume rate units) or may be set to a pre-defined value. When the difference between the target volume level and the current volume level does not exceed the threshold, the volume adjustment rate may be decreased (e.g., by one or more chunk sizes or volume rate units) or may be set to a pre-defined value.

In some embodiments, the volume level of the media asset is gradually adjusted from the first volume level to a second volume level at rate corresponding to the volume adjustment rate based on the user request. Specifically, a volume adjustment rate that includes or is set to three volume rate units may cause the volume to increase/decrease by three percentage values at a time. In such circumstances, when a volume up button is pressed once or held for one second, the volume is increased from one level to a second level that is three percentage values above the one level (e.g., from a level of 10% to 13%) skipping over three percentage values. Similarly, when the volume up button is pressed a second time, the volume is increased from the second level to a third level that is three percentage values above the second level (e.g., from a level of 13% to 16%) skipping over another three percentage values.

In some embodiments, a volume level may be restored to a previously set level, instead of modifying the volume adjustment rate, in response to a request to change the volume level. Specifically, a user may request to reduce the volume of a media asset during a commercial break and responsive to that request, the volume may be reduced at a rate based on the subject matter (e.g., commercial break). When the commercial break is over and the plot segment resumes, the user may request to increase the volume level. Instead of increasing the volume at a volume adjustment rate, the volume may be automatically set to the level that was set just prior to being reduced during the commercial break. This allows the desired volume level to be reached quicker. In particular, in some embodiments, an indication of the first volume level may be stored before the volume level is adjusted (e.g., during a commercial break). A second user request to increase the volume level may be received (e.g., after returning to the plot segment from a commercial break). A determination may be made as to whether the media asset changed before receiving the second user request (e.g., whether the media asset is still in a commercial break or not). In response to determining the media asset has not changed, the volume level is automatically set to the first volume level based on the stored indication and the second user request. In response to determining the media asset has changed to a new media asset, the volume adjustment rate is automatically set to a new volume adjustment rate based on subject matter of the new media asset. The volume level of the media asset is gradually adjusted from the second volume level to a third volume level at rate corresponding to the new volume adjustment rate based on the second user request.

BRIEF DESCRIPTION OF THE DRAWINGS

The above and other features of the present invention, its nature and various advantages will be more apparent upon consideration of the following detailed description, taken in conjunction with the accompanying drawings, and in which:

FIG. 6 is a diagram of an illustrative target volume level data structure in accordance with some embodiments of the disclosure.

DETAILED DESCRIPTION OF EMBODIMENTS

Figure 1:
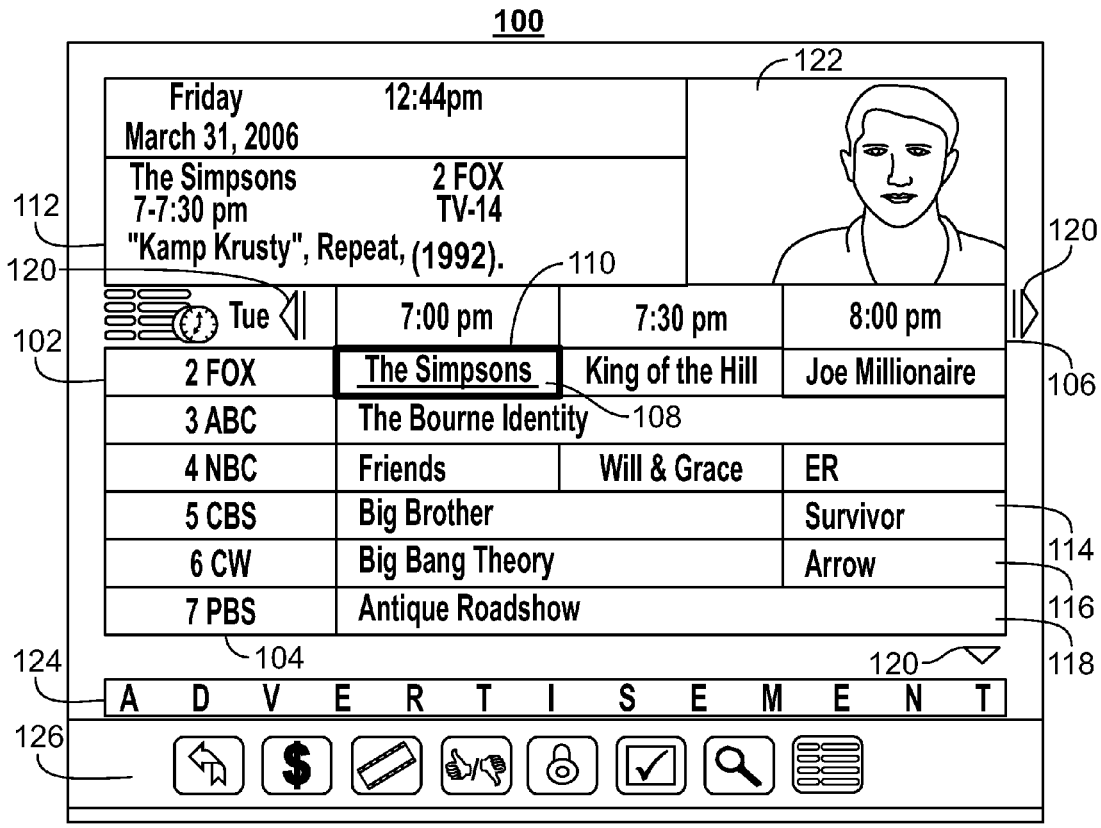
FIG. 1 is a diagram of an interactive grid display in accordance with some embodiments of the disclosure.

The amount of content available to users in any given content delivery system can be substantial. Consequently, many users desire a form of media guidance through an interface that allows users to efficiently navigate content selections and easily identify content that they may desire. An application that provides such guidance is referred to herein as an interactive media guidance application or, sometimes, a media guidance application or a guidance application.

Interactive media guidance applications may take various forms depending on the content for which they provide guidance. One typical type of media guidance application is an interactive television program guide. Interactive television program guides (sometimes referred to as electronic program guides) are well-known guidance applications that, among other things, allow users to navigate among and locate many types of content or media assets. Interactive media guidance applications may generate graphical user interface screens that enable a user to navigate among, locate and select content. As referred to herein, the terms "media asset" and "content" should be understood to mean an electronically consumable user asset, such as television programming, as well as pay-per-view programs, on-demand programs (as in video-on-demand (VOD) systems), Internet content (e.g., streaming content, downloadable content, Webcasts, etc.), video clips, audio, content information, pictures, rotating images, documents, playlists, websites, articles, books, electronic books, blogs, advertisements, chat sessions, social media, applications, games, and/or any other media or multimedia and/or combination of the same. Guidance applications also allow users to navigate among and locate content. As referred to herein, the term "multimedia" should be understood to mean content that utilizes at least two different content forms described above, for example, text, audio, images, video, or interactivity content forms. Content may be recorded, played, displayed or accessed by user equipment devices, but can also be part of a live performance.

Each media asset may include or be associated with certain subject matter. The subject matter included in or associated with a given media asset may change while the media asset is being presented. For example, one portion of the media asset may include commercials (e.g., one form or type of subject matter) and another portion of the media asset may include portions of the plot. In another example, the media asset may include an action segment in one portion and a drama segment in another. Subject matter may be predefined in a media asset data structure received from a remote source (as discussed below). In some implementations, subject matter may be determined on-the-fly automatically based on an analysis of the content being presented to the user. For example, closed-caption information may be processed to determine the subject matter of the content being presented.

As referred to herein the phrase "subject matter" refers to any content criterion or characteristic associated with the media asset. For example, subject matter may indicate whether a portion of a media asset is a commercial segment, whether a portion of a media asset is a plot segment, a type of the media asset, category of the media asset, genre of the media asset, content source of the media asset (e.g., broadcast source, Internet source, on-demand source, music type of source, music type of channel, video type of source, video type channel, etc.), time of day (e.g., morning, afternoon, evening), or any combination thereof.

With the advent of the Internet, mobile computing, and high-speed wireless networks, users are accessing media on user equipment devices on which they traditionally did not. As referred to herein, the phrase "user equipment device," "user equipment," "user device," "electronic device," "electronic equipment," "media equipment device," or "media device" should be understood to mean any device for accessing the content described above, such as a television, a Smart TV, a set-top box, an integrated receiver decoder (IRD) for handling satellite television, a digital storage device, a digital media receiver (DMR), a digital media adapter (DMA), a streaming media device, a DVD player, a DVD recorder, a connected DVD, a local media server, a BLU-RAY player, a BLU-RAY recorder, a personal computer (PC), a laptop computer, a tablet computer, a WebTV box, a personal computer television (PC/TV), a PC media server, a PC media center, a hand-held computer, a stationary telephone, a personal digital assistant (PDA), a mobile telephone, a portable video player, a portable music player, a portable gaming machine, a smart phone, or any other television equipment, computing equipment, or wireless device, and/or combination of the same. In some embodiments, the user equipment device may have a front facing screen and a rear facing screen, multiple front screens, or multiple angled screens. In some embodiments, the user equipment device may have a front facing camera and/or a rear facing camera. On these user equipment devices, users may be able to navigate among and locate the same content available through a television. Consequently, media guidance may be available on these devices, as well. The guidance provided may be for content available only through a television, for content available only through one or more of other types of user equipment devices, or for content available both through a television and one or more of the other types of user equipment devices. The media guidance applications may be provided as on-line applications (i.e., provided on a web-site), or as stand-alone applications or clients on user equipment devices. Various devices and platforms that may implement media guidance applications are described in more detail below.

One of the functions of the media guidance application is to provide media guidance data to users. As referred to herein, the phrase, "media guidance data" or "guidance data" should be understood to mean any data related to content, such as media listings, media-related information (e.g., broadcast times, broadcast channels, titles, descriptions, ratings information (e.g., parental control ratings, critic's ratings, etc.), genre or category information, actor information, logo data for broadcasters' or providers' logos, etc.), media format (e.g., standard definition, high definition, 3D, etc.), advertisement information (e.g., text, images, media clips, etc.), on-demand information, blogs, websites, subject matter information, and any other type of guidance data that is helpful for a user to navigate among and locate desired content selections.

Figure 2:
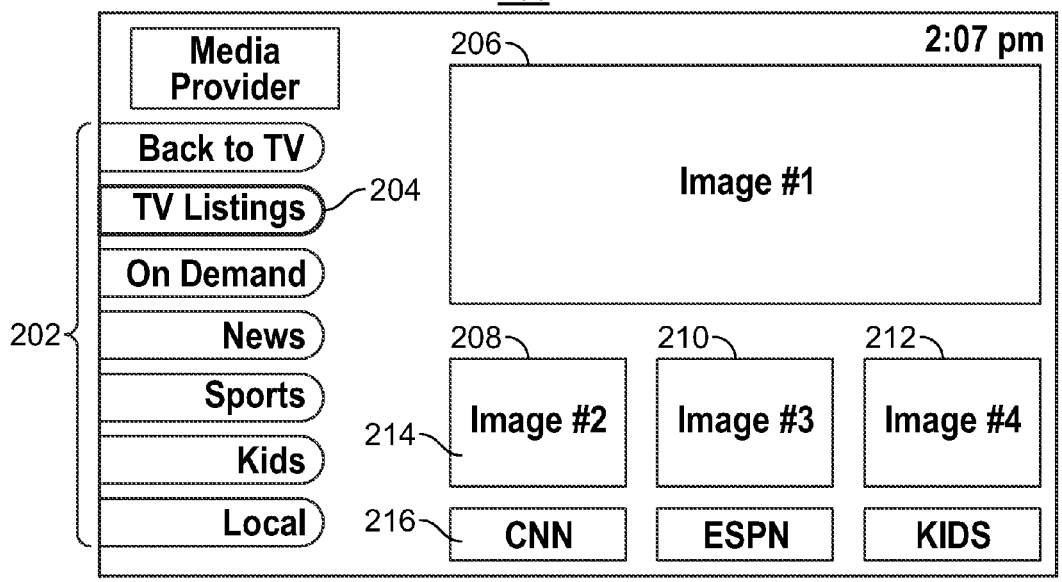
FIG. 2 is a diagram of an interactive media system in accordance with some embodiments of the disclosure.

FIGS. 1-2 show illustrative display screens that may be used to provide media guidance data. The display screens shown in FIGS. 1-2 may be implemented on any suitable user equipment device or platform. While the displays of FIGS. 1-2 are illustrated as full screen displays, they may also be fully or partially overlaid over content being displayed. A user may indicate a desire to access content information by selecting a selectable option provided in a display screen (e.g., a menu option, a listings option, an icon, a hyperlink, etc.) or pressing a dedicated button (e.g., a GUIDE button) on a remote control or other user input interface or device. In response to the user's indication, the media guidance application may provide a display screen with media guidance data organized in one of several ways, such as by time and channel in a grid, by time, by channel, by source, by content type, by category (e.g., movies, sports, news, children, or other categories of programming), or other predefined, user-defined, or other organization criteria. The organization of the media guidance data is determined by guidance application data. As referred to herein, the phrase, "guidance application data" should be understood to mean data used in operating the guidance application, such as program information, guidance application settings, user preferences, or user profile information.

FIG. 1 shows illustrative grid program listings display 100 arranged by time and channel that also enables access to different types of content in a single display. Display 100 may include grid 102 with: (1) a column of channel/content type identifiers 104, where each channel/content type identifier (which is a cell in the column) identifies a different channel or content type available or media asset characteristics; and (2) a row of time identifiers 106, where each time identifier (which is a cell in the row) identifies a time block of programming. The media asset characteristics indicated in column of channel/content type identifiers 104 may include any combination of criteria that identifies a plurality of media assets (e.g., content source of a respective one of the media assets, a content type of the respective one of the media assets, or a content category of the respective one of the media assets). Although grid 102 is a by time-channel grid, any other type of grid may be provided such that time is shown on one dimension and a media characteristic is shown on another. For example, grid 102 may be arranged so that time is shown as in grid 102 and the column of identifiers may represent categories of different media assets or types of content sources (e.g., satellite and Internet). In particular, instead of showing the different programs available on a given channel (e.g., channel 2, FOX) at various times, grid 102 may display different programs that are of the genre or category (comedy) at various times regardless of what source they are received from.

Grid 102 also includes cells of program listings, such as program listing 108, where each listing provides the title of the program provided on the listing's associated channel and time. As referred to herein, the term "program" should be understood to be synonymous with "media". With a user input device, a user can select program listings by moving highlight region 110. Information relating to the program listing selected by highlight region 110 may be provided in program information region 112. Alternatively or in addition, as discussed below in connection with FIGS. 5 and 6, the information may be provided using other cells corresponding to the same transmission time as a program corresponding to the selected listing. Region 112 may include, for example, the program title, the program description, the time the program is provided (if applicable) (e.g., the transmission time of the program), the channel or content source of the program (if applicable), the program's rating, and other desired information.

In addition to providing access to linear programming (e.g., content that is scheduled to be transmitted to a plurality of user equipment devices at a predetermined transmission time and is provided according to a schedule), the media guidance application also provides access to non-linear programming (e.g., content accessible to a user equipment device at any time and is not provided according to a schedule). Non-linear programming may include content from different content sources including on-demand content (e.g., VOD), Internet content (e.g., streaming media, downloadable media, etc.), locally stored content (e.g., content stored on any user equipment device described above or other storage device), or other time-independent content. On-demand content may include movies or any other content provided by a particular content provider (e.g., HBO On Demand providing "The Sopranos" and "Curb Your Enthusiasm"). HBO ON DEMAND is a service mark owned by Time Warner Company L.P. et al. and THE SOPRANOS and CURB YOUR ENTHUSIASM are trademarks owned by the Home Box Office, Inc. Internet content may include web events, such as a chat session or Webcast, or content available on-demand as streaming content or downloadable content through an Internet web site or other Internet access (e.g., FTP).

Grid 102 may provide media guidance data for non-linear programming including on-demand listings, recorded content listings, and Internet content listings. A display combining media guidance data for content from different types of content sources is sometimes referred to as a "mixed-media" display. Various permutations of the types of media guidance data that may be displayed that are different than display 100 may be based on user selection or guidance application definition (e.g., a display of only recorded and broadcast listings, only on-demand and broadcast listings, etc.). In some embodiments, listings for these content types may be included directly in grid 102. Additional media guidance data may be displayed in response to the user selecting one of the navigational icons 120. (Pressing an arrow key on a user input device may affect the display in a similar manner as selecting navigational icons 120.) Specifically, the user may navigate along the time dimension to later or earlier times using icons 120.

Display 100 may also include video region 122, advertisement 124, and options region 126. Video region 122 may allow the user to view and/or preview programs that are currently available, will be available, or were available to the user. The content of video region 122 may correspond to, or be independent from, one of the listings displayed in grid 102. Grid displays including a video region are sometimes referred to as picture-in-guide (PIG) displays. PIG displays and their functionalities are described in greater detail in Satterfield et al. U.S. Pat. No. 6,564,378, issued May 13, 2003 and Yuen et al. U.S. Pat. No. 6,239,794, issued May 29, 2001, which are hereby incorporated by reference herein in their entireties. PIG displays may be included in other media guidance application display screens of the embodiments described herein.

Advertisement 124 may provide an advertisement for content that, depending on a viewer's access rights (e.g., for subscription programming), is currently available for viewing, will be available for viewing in the future, or may never become available for viewing, and may correspond to, or be unrelated to one or more of the content listings in grid 102. Advertisement 124 may also be for products or services related or unrelated to the content displayed in grid 102. Advertisement 124 may be selectable and provide further information about content, provide information about a product or a service, enable purchasing of content, a product, or a service, provide content relating to the advertisement, etc. Advertisement 124 may be targeted based on a user's profile/preferences, monitored user activity, the type of display provided, or on other suitable targeted advertisement bases.

While advertisement 124 is shown as rectangular or banner shaped, advertisements may be provided in any suitable size, shape, and location in a guidance application display. For example, advertisement 124 may be provided as a rectangular shape that is horizontally adjacent to grid 102. This is sometimes referred to as a panel advertisement. In addition, advertisements may be overlaid over content or a guidance application display or embedded within a display. Advertisements may also include text, images, rotating images, video clips, or other types of content described above. Advertisements may be stored in a user equipment device having a guidance application, in a database connected to the user equipment, in a remote location (including streaming media servers), or on other storage means, or a combination of these locations. Providing advertisements in a media guidance application is discussed in greater detail in, for example, Knudson et al., U.S. Patent Application Publication No. 2003/0110499, filed Jan. 17, 2003; Ward, III et al. U.S. Pat. No. 6,756,997, issued Jun. 29, 2004; and Schein et al. U.S. Pat. No. 6,388,714, issued May 14, 2002, which are hereby incorporated by reference herein in their entireties. It will be appreciated that advertisements may be included in other media guidance application display screens of the embodiments described herein.

Options region 126 may allow the user to access different types of content, media guidance application displays, and/or media guidance application features. Options region 126 may be part of display 100 (and other display screens described herein), or may be invoked by a user by selecting an on-screen option or pressing a dedicated or assignable button on a user input device. The selectable options within options region 126 may concern features related to program listings in grid 102 or may include options available from a main menu display. Features related to program listings may include searching for other air times or ways of receiving a program, recording a program, enabling series recording of a program, setting program and/or channel as a favorite, purchasing a program, or other features. Options available from a main menu display may include VOD options, parental control options, Internet options, volume control options, cloud-based options, device synchronization options, second screen device options, options to access various types of media guidance data displays, options to subscribe to a premium service, options to edit a user's profile, options to access a browse overlay, or other options.

The media guidance application may be personalized based on a user's preferences. A personalized media guidance application allows a user to customize displays and features to create a personalized "experience" with the media guidance application. This personalized experience may be created by allowing a user to input these customizations and/or by the media guidance application monitoring user activity to determine various user preferences. Users may access their personalized guidance application by logging in or otherwise identifying themselves to the guidance application. Customization of the media guidance application may be made in accordance with a user profile. The customizations may include varying presentation schemes (e.g., color scheme of displays, font size of text, etc.), aspects of content listings displayed (e.g., only HDTV or only 3D programming, user-specified broadcast channels based on favorite channel selections, re-ordering the display of channels, recommended content, etc.), desired recording features (e.g., recording or series recordings for particular users, recording quality, etc.), parental control settings, automatic dynamic volume rate change control, customized presentation of Internet content (e.g., presentation of social media content, e-mail, electronically delivered articles, etc.) and other desired customizations.

The media guidance application may allow a user to provide user profile information or may automatically compile user profile information. The media guidance application may, for example, monitor the content the user accesses and/or other interactions the user may have with the guidance application. Additionally, the media guidance application may obtain all or part of other user profiles that are related to a particular user (e.g., from other web sites on the Internet the user accesses, such as www.allrovi.com, from other media guidance applications the user accesses, from other interactive applications the user accesses, from another user equipment device of the user, etc.), and/or obtain information about the user from other sources that the media guidance application may access. As a result, a user can be provided with a unified guidance application experience across the user's different user equipment devices. This type of user experience is described in greater detail below in connection with FIG. 4. Additional personalized media guidance application features are described in greater detail in Ellis et al., U.S. Patent Application Publication No. 2005/0251827, filed Jul. 11, 2005, Boyer et al., U.S. Pat. No. 7,165,098, issued Jan. 16, 2007, and Ellis et al., U.S. Patent Application Publication No. 2002/0174430, filed Feb. 21, 2002, which are hereby incorporated by reference herein in their entireties.

Another display arrangement for providing media guidance is shown in FIG. 2. Video mosaic display 200 includes selectable options 202 for content information organized based on content type, genre, and/or other organization criteria. In display 200, television listings option 204 is selected, thus providing listings 206, 208, 210, and 212 as broadcast program listings. In display 200, the listings may provide graphical images including cover art, still images from the content, video clip previews, live video from the content, or other types of content that indicate to a user the content being described by the media guidance data in the listing. Each of the graphical listings may also be accompanied by text to provide further information about the content associated with the listing. For example, listing 208 may include more than one portion, including media portion 214 and text portion 216. Media portion 214 and/or text portion 216 may be selectable to view content in full-screen or to view information related to the content displayed in media portion 214 (e.g., to view listings for the channel that the video is displayed on).

The listings in display 200 are of different sizes (i.e., listing 206 is larger than listings 208, 210, and 212), but if desired, all the listings may be the same size. Listings may be of different sizes or graphically accentuated to indicate degrees of interest to the user or to emphasize certain content, as desired by the content provider or based on user preferences. Various systems and methods for graphically accentuating content listings are discussed in, for example, Yates, U.S. Patent Application Publication No. 2010/0153885, filed Dec. 29, 2005, which is hereby incorporated by reference herein in its entirety.

Figure 3:
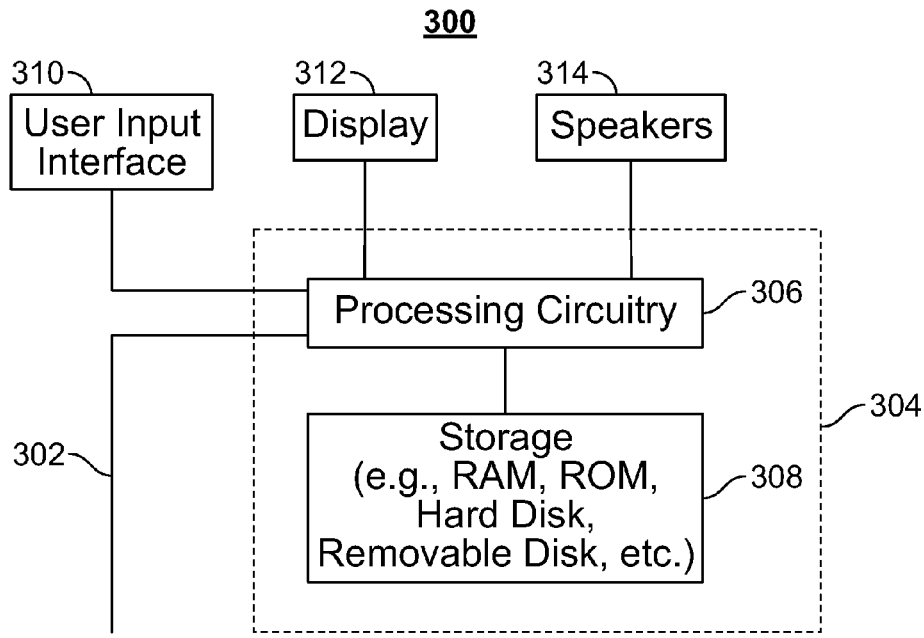
FIG. 3 is a block diagram of an illustrative user equipment device in accordance with some embodiments of the disclosure.

Users may access content and the media guidance application (and its display screens described above and below) from one or more of their user equipment devices. FIG. 3 shows a generalized embodiment of illustrative user equipment device 300. More specific implementations of user equipment devices are discussed below in connection with FIG. 4. User equipment device 300 may receive content and data via input/output (hereinafter "I/O") path 302. I/O path 302 may provide content (e.g., broadcast programming, on-demand programming, Internet content, content available over a local area network (LAN) or wide area network (WAN), and/or other content) and data to control circuitry 304, which includes processing circuitry 306 and storage 308. Control circuitry 304 may be used to send and receive commands, requests, and other suitable data using I/O path 302. I/O path 302 may connect control circuitry 304 (and specifically processing circuitry 306) to one or more communications paths (described below). I/O functions may be provided by one or more of these communications paths, but are shown as a single path in FIG. 3 to avoid overcomplicating the drawing.

Control circuitry 304 may be based on any suitable processing circuitry such as processing circuitry 306. As referred to herein, processing circuitry should be understood to mean circuitry based on one or more microprocessors, microcontrollers, digital signal processors, programmable logic devices, field-programmable gate arrays (FPGAs), application-specific integrated circuits (ASICs), etc., and may include a multi-core processor (e.g., dual-core, quad-core, hexa-core, or any suitable number of cores) or supercomputer. In some embodiments, processing circuitry may be distributed across multiple separate processors or processing units, for example, multiples of the same type of processing units (e.g., two Intel Core i7 processors) or multiple different processors (e.g., an Intel Core i5 processor and an Intel Core i7 processor). In some embodiments, control circuitry 304 executes instructions for a media guidance application stored in memory (i.e., storage 308). Specifically, control circuitry 304 may be instructed by the media guidance application to perform the functions discussed above and below. For example, the media guidance application may provide instructions to control circuitry 304 to generate the media guidance displays. In some implementations, any action performed by control circuitry 304 may be based on instructions received from the media guidance application.

In client-server based embodiments, control circuitry 304 may include communications circuitry suitable for communicating with a guidance application server or other networks or servers. The instructions for carrying out the above-mentioned functionality may be stored on the guidance application server. Communications circuitry may include a cable modem, an integrated services digital network (ISDN) modem, a digital subscriber line (DSL) modem, a telephone modem, Ethernet card, or a wireless modem for communications with other equipment, or any other suitable communications circuitry. Such communications may involve the Internet or any other suitable communications networks or paths (which is described in more detail in connection with FIG. 4). In addition, communications circuitry may include circuitry that enables peer-to-peer communication of user equipment devices, or communication of user equipment devices in locations remote from each other (described in more detail below).

Memory may be an electronic storage device provided as storage 308 that is part of control circuitry 304. As referred to herein, the phrase "electronic storage device" or "storage device" should be understood to mean any device for storing electronic data, computer software, or firmware, such as random-access memory, read-only memory, hard drives, optical drives, digital video disc (DVD) recorders, compact disc (CD) recorders, BLU-RAY disc (BD) recorders, BLU-RAY 3D disc recorders, digital video recorders (DVR, sometimes called a personal video recorder, or PVR), solid state devices, quantum storage devices, gaming consoles, gaming media, or any other suitable fixed or removable storage devices, and/or any combination of the same. Storage 308 may be used to store various types of content described herein as well as media guidance information, described above, and guidance application data, described above. Nonvolatile memory may also be used (e.g., to launch a boot-up routine and other instructions). Cloud-based storage, described in relation to FIG. 4, may be used to supplement storage 308 or instead of storage 308.

Control circuitry 304 may include video generating circuitry and tuning circuitry, such as one or more analog tuners, one or more MPEG-2 decoders or other digital decoding circuitry, high-definition tuners, or any other suitable tuning or video circuits or combinations of such circuits. Encoding circuitry (e.g., for converting over-the-air, analog, or digital signals to MPEG signals for storage) may also be provided. Control circuitry 304 may also include scaler circuitry for upconverting and downconverting content into the preferred output format of the user equipment 300. Circuitry 304 may also include digital-to-analog converter circuitry and analog-to-digital converter circuitry for converting between digital and analog signals. The tuning and encoding circuitry may be used by the user equipment device to receive and to display, to play, or to record content. The tuning and encoding circuitry may also be used to receive guidance data. The circuitry described herein, including for example, the tuning, video generating, encoding, decoding, encrypting, decrypting, scaler, and analog/digital circuitry, may be implemented using software running on one or more general purpose or specialized processors. Multiple tuners may be provided to handle simultaneous tuning functions (e.g., watch and record functions, picture-in-picture (PIP) functions, multiple-tuner recording, etc.). If storage 308 is provided as a separate device from user equipment 300, the tuning and encoding circuitry (including multiple tuners) may be associated with storage 308.

Control circuitry 304 may include dynamic volume rate adjustment circuitry (not shown). The dynamic volume rate adjustment circuitry may adjust automatically the rate at which volume is changed in response to user requests to change volume. The dynamic volume rate adjustment circuitry may monitor volume adjustments made by the user on an on-going basis to set the volume rate adjustments for different content subject matters. The dynamic volume rate adjustment circuitry may be engaged and used when requested by the user. In some implementations, the dynamic volume rate adjustment circuitry may constantly be engaged. When the dynamic volume rate adjustment circuitry is not engaged, the volume adjustments are made in accordance with a default adjustment rate (e.g., at a same rate for all media content regardless of subject matter). When the dynamic volume rate adjustment circuitry is engaged, the dynamic volume rate adjustment circuitry may operate as discussed above and below to dynamically adjust the rate at which volume is modified based on content subject matter. In some implementations, the dynamic volume rate adjustment circuitry may be engaged by the user by pressing a suitable button prior to requesting volume adjustment. For example, the user may press a volume rate key on a user interface prior to selecting a volume up or down key on the user interface.

For example, the dynamic volume rate adjustment circuitry may store an indication that the user typically enjoys watching action/adventure type subject matter content at a volume level of 80% and that the user typically enjoys watching commercials (or advertisement) type subject matter content at a volume level of 20%. The dynamic volume rate adjustment circuitry may store these indications in a database in storage 308 as target volume levels. In response to receiving a user request to adjust the volume up or down, the dynamic volume rate adjustment circuitry may determine the subject matter of the content currently being watched by the user. The dynamic volume rate adjustment circuitry may determine whether a previously set target volume level has been stored in the database in storage 308. The dynamic volume rate adjustment circuitry may retrieve a previously stored volume level and compare that level to a current volume level of the content being presented. In response to determining that the current volume level is more than a threshold difference away from the target volume level, the dynamic volume rate adjustment circuitry may increase the volume rate adjustment level. Alternatively, in response to determining that the current volume level is less than or equal to the threshold difference from the target volume level, the dynamic volume rate adjustment circuitry may decrease the volume rate adjustment level. The dynamic volume rate adjustment circuitry may adjust the volume up or down based on the user request according to the set volume adjustment rate.

The volume threshold may be stored in the database in storage 308 along with the corresponding target volume rate. In some implementations, the volume threshold may be set by the user with a suitable user interface. In some implementations, the volume threshold may be set dynamically based on the subject matter of the content being watched. In some implementations, the volume threshold may be set based on a profile and/or time of day.

As referred to herein the phrase "volume level" refers to how loud or soft the sound corresponding to a media asset is being output through speakers or headphones. The volume may be expressed as a percentage of the maximum possible amount or as a decibel level. For simplicity, this disclosure refers to the volume level as a percentage.

As referred to herein the phrase "target volume level" refers to a desired volume level for a given media asset. The target volume level may be set by the user through a suitable user interface (e.g., graphical user interface). In some implementations, the target volume level is automatically set for different media content subject matters based on monitored user interactions with the content.

As referred to herein the phrase "volume rate adjustment rate," "volume adjustment rate," "volume rate," or any variation thereof refers to the speed at which a volume level of content is changed from one level to another in response to a user request to increase or decrease the volume level. For example, a high volume rate causes a volume level to change from an 80% level to 30% level in response to a single user request to reduce the volume level. The single user request may be received by the user pressing a suitable button one time or by the user holding down a suitable button for some length of time (e.g., 1 second). Similarly, a low volume rate causes a volume level to change from an 80% level to 60% level in response to a single user request to reduce the volume level. The single user request may be received by the user pressing a suitable button one time or by the user holding down a suitable button for some length of time (e.g., 1 second). In particular, when the volume rate is high, a single user request or the user pressing and holding a volume down button for a short period of time (e.g., 1 second) may cause the volume level to be reduced from 80% to 30%. However, when the volume rate is low, to reach a volume level of 30% from a level of 80% may require multiple user requests to be received to reduce the volume level or may require the user to press and hold the volume down button for a longer period of time (e.g., 2 seconds).

A user may send instructions to control circuitry 304 using user input interface 310. User input interface 310 may be any suitable user interface, such as a remote control, mouse, trackball, keypad, keyboard, touch screen, touchpad, stylus input, joystick, voice recognition interface, or other user input interfaces. Display 312 may be provided as a stand-alone device or integrated with other elements of user equipment device 300. Display 312 may be one or more of a monitor, a television, a liquid crystal display (LCD) for a mobile device, or any other suitable equipment for displaying visual images. In some embodiments, display 312 may be HDTV-capable. In some embodiments, display 312 may be a 3D display, and the interactive media guidance application and any suitable content may be displayed in 3D. A video card or graphics card may generate the output to the display 312. The video card may offer various functions such as accelerated rendering of 3D scenes and 2D graphics, MPEG-2/MPEG-4 decoding, TV output, or the ability to connect multiple monitors. The video card may be any processing circuitry described above in relation to control circuitry 304. The video card may be integrated with the control circuitry 304. Speakers 314 may be provided as integrated with other elements of user equipment device 300 or may be stand-alone units. The audio component of videos and other content displayed on display 312 may be played through speakers 314. In some embodiments, the audio may be distributed to a receiver (not shown), which processes and outputs the audio via speakers 314.

The guidance application may be implemented using any suitable architecture. For example, it may be a stand-alone application wholly implemented on user equipment device 300. In such an approach, instructions of the application are stored locally, and data for use by the application is downloaded on a periodic basis (e.g., from an out-of-band feed, from an Internet resource, or using another suitable approach). In some embodiments, the media guidance application is a client-server based application. Data for use by a thick or thin client implemented on user equipment device 300 is retrieved on-demand by issuing requests to a server remote to the user equipment device 300. In one example of a client-server based guidance application, control circuitry 304 runs a web browser that interprets web pages provided by a remote server.

In some embodiments, the media guidance application is downloaded and interpreted or otherwise run by an interpreter or virtual machine (run by control circuitry 304). In some embodiments, the guidance application may be encoded in the ETV Binary Interchange Format (EBIF), received by control circuitry 304 as part of a suitable feed, and interpreted by a user agent running on control circuitry 304. For example, the guidance application may be an EBIF application. In some embodiments, the guidance application may be defined by a series of JAVA-based files that are received and run by a local virtual machine or other suitable middleware executed by control circuitry 304. In some of such embodiments (e.g., those employing MPEG-2 or other digital media encoding schemes), the guidance application may be, for example, encoded and transmitted in an MPEG-2 object carousel with the MPEG audio and video packets of a program.

Figure 4:
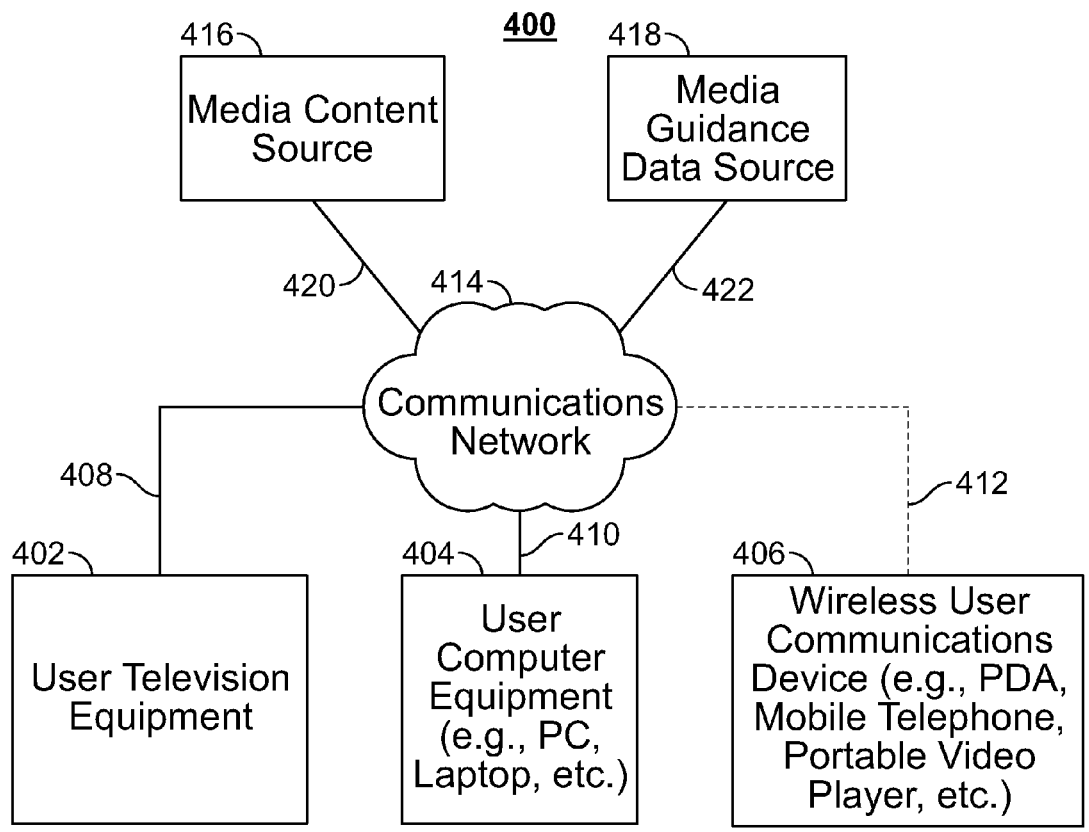
FIG. 4 is a block diagram of an illustrative media system in accordance with some embodiments of the disclosure.

User equipment device 300 of FIG. 3 can be implemented in system 400 of FIG. 4 as user television equipment 402, user computer equipment 404, wireless user communications device 406, or any other type of user equipment suitable for accessing content, such as a non-portable gaming machine. For simplicity, these devices may be referred to herein collectively as user equipment or user equipment devices, and may be substantially similar to user equipment devices described above. User equipment devices, on which a media guidance application may be implemented, may function as a standalone device or may be part of a network of devices. Various network configurations of devices may be implemented and are discussed in more detail below.

A user equipment device utilizing at least some of the system features described above in connection with FIG. 3 may not be classified solely as user television equipment 402, user computer equipment 404, or a wireless user communications device 406. For example, user television equipment 402 may, like some user computer equipment 404, be Internet-enabled allowing for access to Internet content, while user computer equipment 404 may, like some television equipment 402, include a tuner allowing for access to television programming. The media guidance application may have the same layout on various different types of user equipment or may be tailored to the display capabilities of the user equipment. For example, on user computer equipment 404, the guidance application may be provided as a website accessed by a web browser. In another example, the guidance application may be scaled down for wireless user communications devices 406.

In system 400, there is typically more than one of each type of user equipment device but only one of each is shown in FIG. 4 to avoid overcomplicating the drawing. In addition, each user may utilize more than one type of user equipment device and also more than one of each type of user equipment device.

In some embodiments, a user equipment device (e.g., user television equipment 402, user computer equipment 404, wireless user communications device 406) may be referred to as a "second screen device." For example, a second screen device may supplement content presented on a first user equipment device. The content presented on the second screen device may be any suitable content that supplements the content presented on the first device. In some embodiments, the second screen device provides an interface for adjusting settings and display preferences of the first device.

In some embodiments, the second screen device is configured for interacting with other second screen devices or for interacting with a social network. The second screen device can be located in the same room as the first device, a different room from the first device but in the same house or building, or in a different building from the first device.

The user may also set various settings to maintain consistent media guidance application settings across in-home devices and remote devices. Settings include those described herein, as well as channel and program favorites, programming preferences that the guidance application utilizes to make programming recommendations, display preferences, target volume levels, volume thresholds, volume adjustment rates, and other desirable guidance settings. For example, if a user sets a channel as a favorite on, for example, the website www.allrovi.com on their personal computer at their office, the same channel would appear as a favorite on the user's in-home devices (e.g., user television equipment and user computer equipment) as well as the user's mobile devices, if desired. Therefore, changes made on one user equipment device can change the guidance experience on another user equipment device, regardless of whether they are the same or a different type of user equipment device. In addition, the changes made may be based on settings input by a user, as well as user activity monitored by the guidance application.

The user equipment devices may be coupled to communications network 414. Namely, user television equipment 402, user computer equipment 404, and wireless user communications device 406 are coupled to communications network 414 via communications paths 408, 410, and 412, respectively. Communications network 414 may be one or more networks including the Internet, a mobile phone network, mobile voice or data network (e.g., a 4G or LTE network), cable network, public switched telephone network, or other types of communications network or combinations of communications networks. Paths 408, 410, and 412 may separately or together include one or more communications paths, such as, a satellite path, a fiber-optic path, a cable path, a path that supports Internet communications (e.g., IPTV), free-space connections (e.g., for broadcast or other wireless signals), or any other suitable wired or wireless communications path or combination of such paths. Path 412 is drawn with dotted lines to indicate that in the exemplary embodiment shown in FIG. 4 it is a wireless path and paths 408 and 410 are drawn as solid lines to indicate they are wired paths (although these paths may be wireless paths, if desired). Communications with the user equipment devices may be provided by one or more of these communications paths, but are shown as a single path in FIG. 4 to avoid overcomplicating the drawing.

Although communications paths are not drawn between user equipment devices, these devices may communicate directly with each other via communication paths, such as those described above in connection with paths 408, 410, and 412, as well as other short-range point-to-point communication paths, such as USB cables, IEEE 1394 cables, wireless paths (e.g., Bluetooth, infrared, IEEE 802-11x, etc.), or other short-range communication via wired or wireless paths. BLUETOOTH is a certification mark owned by Bluetooth SIG, INC. The user equipment devices may also communicate with each other directly through an indirect path via communications network 414.

System 400 includes content source 416 and media guidance data source 418 coupled to communications network 414 via communication paths 420 and 422, respectively. Paths 420 and 422 may include any of the communication paths described above in connection with paths 408, 410, and 412. Communications with the content source 416 and media guidance data source 418 may be exchanged over one or more communications paths, but are shown as a single path in FIG. 4 to avoid overcomplicating the drawing. In addition, there may be more than one of each of content source 416 and media guidance data source 418, but only one of each is shown in FIG. 4 to avoid overcomplicating the drawing. (The different types of each of these sources are discussed below.) If desired, content source 416 and media guidance data source 418 may be integrated as one source device. Although communications between sources 416 and 418 with user equipment devices 402, 404, and 406 are shown as through communications network 414, in some embodiments, sources 416 and 418 may communicate directly with user equipment devices 402, 404, and 406 via communication paths (not shown) such as those described above in connection with paths 408, 410, and 412.

Content source 416 may include one or more types of content distribution equipment including a television distribution facility, cable system headend, satellite distribution facility, programming sources (e.g., television broadcasters, such as NBC, ABC, HBO, etc.), intermediate distribution facilities and/or servers, Internet providers, on-demand media servers, and other content providers. NBC is a trademark owned by the National Broadcasting Company, Inc., ABC is a trademark owned by the American Broadcasting Company, Inc., and HBO is a trademark owned by the Home Box Office, Inc. Content source 416 may be the originator of content (e.g., a television broadcaster, a Webcast provider, etc.) or may not be the originator of content (e.g., an on-demand content provider, an Internet provider of content of broadcast programs for downloading, etc.). Content source 416 may include cable sources, satellite providers, on-demand providers, Internet providers, over-the-top content providers, or other providers of content. Content source 416 may also include a remote media server used to store different types of content (including video content selected by a user), in a location remote from any of the user equipment devices. Systems and methods for remote storage of content, and providing remotely stored content to user equipment are discussed in greater detail in connection with Ellis et al., U.S. Pat. No. 7,761,892, issued Jul. 20, 2010, which is hereby incorporated by reference herein in its entirety.

Media guidance data source 418 may provide media guidance data, such as the media guidance data described above. Media guidance application data may be provided to the user equipment devices using any suitable approach. In some embodiments, the guidance application may be a stand-alone interactive television program guide that receives program guide data via a data feed (e.g., a continuous feed or trickle feed). Program schedule data and other guidance data may be provided to the user equipment on a television channel sideband, using an in-band digital signal, using an out-of-band digital signal, or by any other suitable data transmission technique. Program schedule data and other media guidance data may be provided to user equipment on multiple analog or digital television channels.

In some embodiments, guidance data from media guidance data source 418 may be provided to users' equipment using a client-server approach. For example, a user equipment device may pull media guidance data from a server, or a server may push media guidance data to a user equipment device. In some embodiments, a guidance application client residing on the user's equipment may initiate sessions with source 418 to obtain guidance data when needed, e.g., when the guidance data is out of date or when the user equipment device receives a request from the user to receive data. Media guidance may be provided to the user equipment with any suitable frequency (e.g., continuously, daily, a user-specified period of time, a system-specified period of time, in response to a request from user equipment, etc.). Media guidance data source 418 may provide user equipment devices 402, 404, and 406 the media guidance application itself or software updates for the media guidance application.

Media guidance applications may be, for example, stand-alone applications implemented on user equipment devices. For example, the media guidance application may be implemented as software or a set of executable instructions which may be stored in storage 308, and executed by control circuitry 304 of a user equipment device 300. In some embodiments, media guidance applications may be client-server applications where only a client application resides on the user equipment device, and server application resides on a remote server. For example, media guidance applications may be implemented partially as a client application on control circuitry 304 of user equipment device 300 and partially on a remote server as a server application (e.g., media guidance data source 418) running on control circuitry of the remote server. When executed by control circuitry of the remote server (such as media guidance data source 418), the media guidance application may instruct control circuitry 304 to generate the guidance application displays and transmit the generated displays to the user equipment devices. The server application may instruct control circuitry 304 of the media guidance data source 418 to transmit data for storage on the user equipment. The client application may instruct control circuitry 304 of the receiving user equipment to generate the guidance application displays.

Content and/or media guidance data delivered to user equipment devices 402, 404, and 406 may be over-the-top (OTT) content. OTT content delivery allows Internet-enabled user devices, including any user equipment device described above, to receive content that is transferred over the Internet, including any content described above, in addition to content received over cable or satellite connections. OTT content is delivered via an Internet connection provided by an Internet service provider (ISP), but a third party distributes the content. The ISP may not be responsible for the viewing abilities, copyrights, or redistribution of the content, and may only transfer IP packets provided by the OTT content provider. Examples of OTT content providers include YOUTUBE, NETFLIX, and HULU, which provide audio and video via IP packets. YouTube is a trademark owned by Google Inc., Netflix is a trademark owned by Netflix Inc., and Hulu is a trademark owned by Hulu, LLC. OTT content providers may additionally or alternatively provide media guidance data described above. In addition to content and/or media guidance data, providers of OTT content can distribute media guidance applications (e.g., web-based applications or cloud-based applications), or the content can be displayed by media guidance applications stored on the user equipment device.

Media guidance system 400 is intended to illustrate a number of approaches, or network configurations, by which user equipment devices and sources of content and guidance data may communicate with each other for the purpose of accessing content and providing media guidance. The embodiments described herein may be applied in any one or a subset of these approaches, or in a system employing other approaches for delivering content and providing media guidance. The following four approaches provide specific illustrations of the generalized example of FIG. 4.

In one approach, user equipment devices may communicate with each other within a home network. User equipment devices can communicate with each other directly via short-range point-to-point communication schemes described above, via indirect paths through a hub or other similar device provided on a home network, or via communications network 414. Each of the multiple individuals in a single home may operate different user equipment devices on the home network. As a result, it may be desirable for various media guidance information or settings to be communicated between the different user equipment devices. For example, it may be desirable for users to maintain consistent media guidance application settings on different user equipment devices within a home network, as described in greater detail in Ellis et al., U.S. patent application Ser. No. 11/179,410, filed Jul. 11, 2005. Different types of user equipment devices in a home network may also communicate with each other to transmit content. For example, a user may transmit content from user computer equipment to a portable video player or portable music player.

In a second approach, users may have multiple types of user equipment by which they access content and obtain media guidance. For example, some users may have home networks that are accessed by in-home and mobile devices. Users may control in-home devices via a media guidance application implemented on a remote device. For example, users may access an online media guidance application on a website via a personal computer at their office, or a mobile device such as a PDA or web-enabled mobile telephone. The user may set various settings (e.g., recordings, reminders, or other settings) on the online guidance application to control the user's in-home equipment. The online guide may control the user's equipment directly, or by communicating with a media guidance application on the user's in-home equipment. Various systems and methods for user equipment devices communicating, where the user equipment devices are in locations remote from each other, is discussed in, for example, Ellis et al., U.S. Pat. No. 8,046,801, issued Oct. 25, 2011, which is hereby incorporated by reference herein in its entirety.

In a third approach, users of user equipment devices inside and outside a home can use their media guidance application to communicate directly with content source 416 to access content. Specifically, within a home, users of user television equipment 402 and user computer equipment 404 may access the media guidance application to navigate among and locate desirable content. Users may also access the media guidance application outside of the home using wireless user communications devices 406 to navigate among and locate desirable content.

In a fourth approach, user equipment devices may operate in a cloud computing environment to access cloud services. In a cloud computing environment, various types of computing services for content sharing, storage or distribution (e.g., video sharing sites or social networking sites) are provided by a collection of network-accessible computing and storage resources, referred to as "the cloud." For example, the cloud can include a collection of server computing devices, which may be located centrally or at distributed locations, which provide cloud-based services to various types of users and devices connected via a network such as the Internet via communications network 414. These cloud resources may include one or more content sources 416 and one or more media guidance data sources 418. In addition or in the alternative, the remote computing sites may include other user equipment devices, such as user television equipment 402, user computer equipment 404, and wireless user communications device 406. For example, the other user equipment devices may provide access to a stored copy of a video or a streamed video. In such embodiments, user equipment devices may operate in a peer-to-peer manner without communicating with a central server.

The cloud provides access to services, such as content storage, content sharing, or social networking services, among other examples, as well as access to any content described above, for user equipment devices. Services can be provided in the cloud through cloud computing service providers, or through other providers of online services. For example, the cloud-based services can include a content storage service, a content sharing site, a social networking site, or other services via which user-sourced content is distributed for viewing by others on connected devices. These cloud-based services may allow a user equipment device to store content to the cloud and to receive content from the cloud rather than storing content locally and accessing locally-stored content.

A user may use various content capture devices, such as camcorders, digital cameras with video mode, audio recorders, mobile phones, and handheld computing devices, to record content. The user can upload content to a content storage service on the cloud either directly, for example, from user computer equipment 404 or wireless user communications device 406 having content capture feature. Alternatively, the user can first transfer the content to a user equipment device, such as user computer equipment 404. The user equipment device storing the content uploads the content to the cloud using a data transmission service on communications network 414. In some embodiments, the user equipment device itself is a cloud resource, and other user equipment devices can access the content directly from the user equipment device on which the user stored the content.

Cloud resources may be accessed by a user equipment device using, for example, a web browser, a media guidance application, a desktop application, a mobile application, and/or any combination of access applications of the same type. The user equipment device may be a cloud client that relies on cloud computing for application delivery, or the user equipment device may have some functionality without access to cloud resources. For example, some applications running on the user equipment device may be cloud applications, i.e., applications delivered as a service over the Internet, while other applications may be stored and run on the user equipment device. In some embodiments, a user device may receive content from multiple cloud resources simultaneously. For example, a user device can stream audio from one cloud resource while downloading content from a second cloud resource. Or a user device can download content from multiple cloud resources for more efficient downloading. In some embodiments, user equipment devices can use cloud resources for processing operations such as the processing operations performed by processing circuitry described in relation to FIG. 3.

In some embodiments, control circuitry 304 may generate a database of target volumes by monitoring user interactions with content presented to the user. Each entry in the database may represent a target volume rate for a given media asset subject matter. In some implementations, the entries in the database may be modified by the user. Each entry in the database may include a data structure having multiple fields as shown and described below in connection with FIG. 6.

Figure 5:
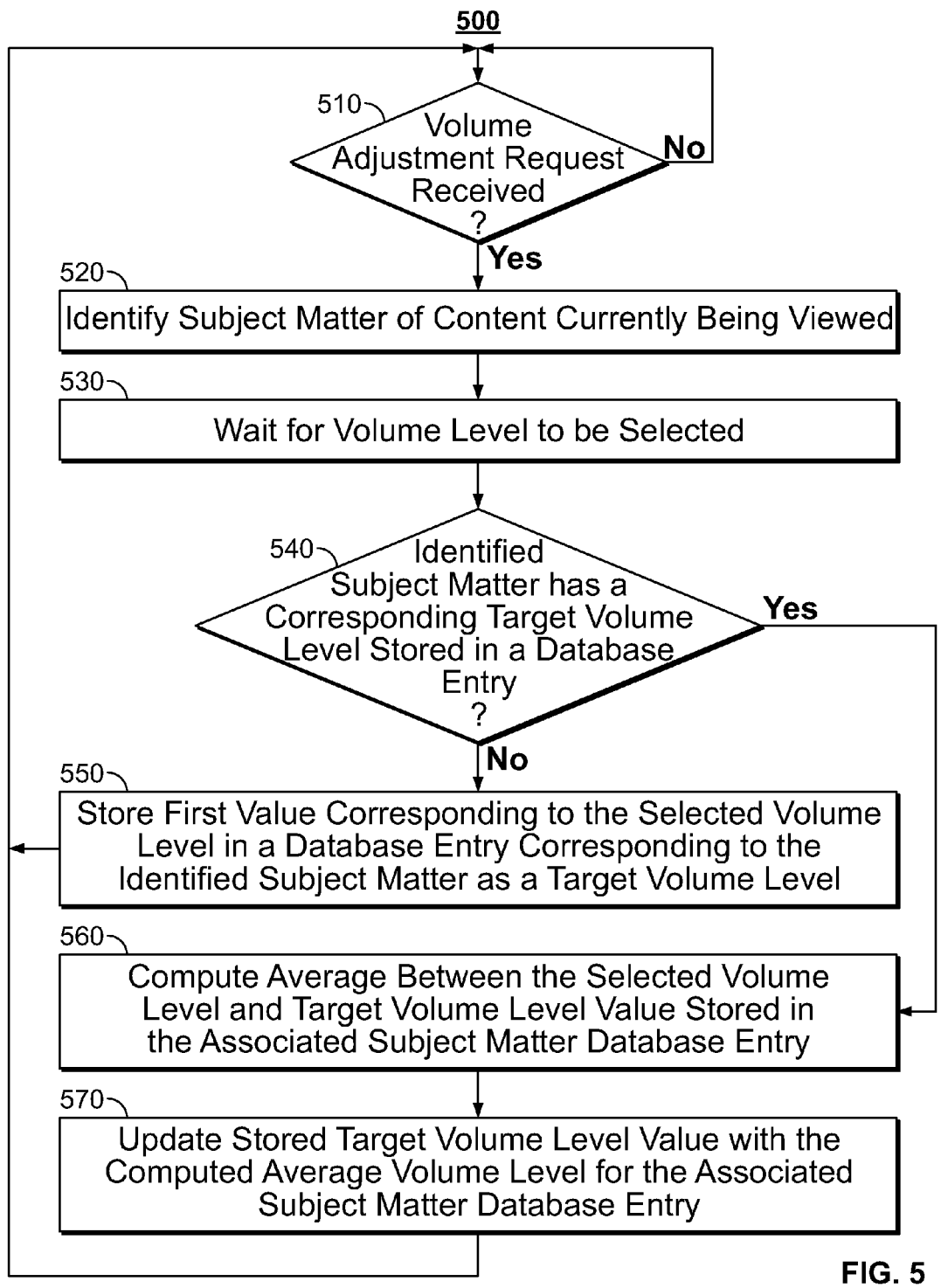
FIG. 5 is a flow diagram describing the process of populating a target volume level database in accordance with some embodiments of the disclosure.

FIG. 5 is a flow diagram describing the process 500 of populating a target volume level database in accordance with some embodiments of the disclosure. At step 510, a determination is made as to whether a volume adjustment request is received. In response to determining that a volume adjustment request is received, the process proceeds to step 520, otherwise the process returns to step 510. Control circuitry 304 may continuously or at predetermined intervals monitor for volume adjustment requests. In some embodiments, each time control circuitry 304 receives a volume adjustment request, control circuitry 304 may execute process 500.

For example, while a user is viewing a piece of media content, the user may desire to increase or decrease the volume level. For example, the user may be watching an action movie which the user typically enjoys at a high volume level (e.g., 80%). However, the current volume level may be set at 20%. Accordingly, the user may operate a suitable user interface (e.g., a remote control) and issue an instruction to control circuitry 304 to increase the volume level by pressing a suitable key on the remote control (e.g., a volume up key). Control circuitry 304 may receive this instruction as a request to adjust the volume level.

At step 520, the subject matter of the content currently being viewed or presented is identified. For example, control circuitry 304, in response to receiving the request to adjust the volume level, may retrieve media guidance data associated with the content currently being presented from storage 308. Alternatively, control circuitry 304 may process data received concurrently with the media content being presented to identify the subject matter. Although the above and below discussion pertains to the dynamic adjustment of a volume rate based on one subject matter, a combination of subject matters may be considered when setting the volume adjustment rate. For example, the subject matter of the content being presented may be identified as a combination of subject matters (e.g., time of day and category or genre of content). The combined subject matter may be processed in a similar manner as the one subject matter in steps 540, 550, 560 and 570.

For example, control circuitry 304 may determine a title or content identifier of the content being presented. Using the determined title or content identifier, control circuitry 304 may retrieve a data structure from storage 308 corresponding to the title or content identifier. The data structure may indicate the subject matter of the content being presented. In particular, the data structure may indicate the content being presented is an action/adventure type of media asset. In some implementations, control circuitry 304 may periodically or continuously monitor the attributes of the content being presented to determine subject matter of the content.

In some embodiments, to determine the subject matter for the currently presented content, control circuitry 304 may retrieve from storage 308 a data structure associated with the content being presented. Specifically, control circuitry 304 may generate an SQL query that includes the current time and the content source being accessed. Control circuitry 304 may transmit the SQL query to a local or remote database. The local or remote database may identify a data structure associated with content provided on the content source at the specified time and may return the data structure back to control circuitry 304. The data structure may include multiple fields. For example, the data structure may include a title field that identifies the title of the accessed content, a related content field identifying related content, a scheduled transmission time field identifying the period of time during which the content is available from the content source, a detailed description field, and subject matter fields which specify different attributes associated with the content. Control circuitry 304 may retrieve the data structure for the currently presented content before, during or after accessing the content source from which the content is being received and presented.

In some embodiments, control circuitry 304 may analyze closed-caption data or may re-transmit and request updated data structures for the content being presented on the selected content source from a local or remote database. For example, control circuitry 304 may process text in currently received closed-caption data to determine the subject matter of the content being presented. In some implementations, control circuitry 304 may determine subject matter of the currently presented content based on the absence of closed-caption data. Specifically, when no closed-caption data is received for a given media asset, control circuitry 304 may determine that the subject matter is a commercial or advertisement segment. Whereas when closed-caption data is presented or is being received, control circuitry 304 may determine that the subject matter is a plot segment.

At step 530, the process waits for the volume level to be selected. For example, after receiving the user request to adjust the volume level, control circuitry 304 may wait a predetermined amount of time (e.g., 10 seconds) until the volume level reaches the level desired by the user. Specifically, the user may select a volume up key to increase the volume and after a few seconds, the user may decide to increase the volume level some more. Thus, the user may press the volume up key again which may be interpreted as an additional volume adjustment request. Accordingly, the volume level may reach steady state only where no more user adjustments are received or expected to be received when the content with the same subject matter is presented to the user at a currently selected level for more than the predetermined amount of time (e.g., 10 seconds). The predetermined amount of time may be set by the user or may be a default amount stored in storage 308. In some implementations, step 530 may be omitted or skipped.

At step 540, a determination is made as to whether the identified subject matter has a corresponding target volume level stored in a database entry. In response to determining that the identified subject matter has a corresponding target volume level, the process proceeds to step 560, otherwise the process proceeds to step 550. For example, control circuitry 304 may generate an SQL query that includes the identified subject matter and transmit the SQL query to a target volume level database that is stored locally or remotely in storage 308. The database may receive the SQL query and cross-reference the identified subject matter with a list of stored subject matters to determine whether there exists an entry for the identified subject matter. For example, the database may process each subject matter field 620 for each subject matter entry 610 stored in the database to determine whether the contents stored in field 620 match the subject matter indicated in the SQL query.

In response to determining that an entry exists (e.g., that a given subject matter entry 610 has a field 620 that matches the received subject matter), the database may return to control circuitry 304 the database entry 600 corresponding to the identified subject matter. Database entry 600 may be a target volume level data structure that has various fields associated with target volume levels. In response to determining that no entry exists (e.g., that no subject matter entry 610 has a field 620 that matches the received subject matter), the database may return to control circuitry 304 a NULL indicator indicating to control circuitry that the identified subject matter has no previously stored target volume level.

The identified subject matter may have no previously stored target volume level because user interactions have never been monitored for the identified subject matter. In some embodiments, the identified subject matter may not yet have a stored entry in the database because the user has not previously specified a volume level for the subject matter.

At step 550, a first value corresponding to the selected volume level is stored in a database entry corresponding to the identified subject matter as a target volume level. For example, in the case that the identified subject matter has no previously stored target volume level, control circuitry 304 may transmit a request to the target volume level database to create an entry 600 for the identified subject matter. Specifically, control circuitry 304 may generate an SQL query that includes the identified subject matter, an instruction to create entry 600 for the identified subject matter, and the currently selected volume level for the subject matter. Control circuitry 304 may transmit the SQL query to the target volume level database that is stored locally or remotely in storage 308. The database may receive the SQL query and generate entry 600 corresponding to the identified subject matter.

In some embodiments, entry 600, shown in FIG. 6, of the volume level database may include a plurality of fields. The fields may include multiple subject matter entries 610, a subject matter field 620, a target volume level field 630 and a threshold field 640. The database may store the subject matter indicated in the SQL query to subject matter field 620. Subject matter field 620 indicates the subject matter for a given subject matter entry 610. For example, the subject matter field 620 may correspond to a commercial segment or advertising segment subject matter. The subject matter field 620 may correspond to given type of content category or genre subject matter (e.g., action/adventure). The subject matter field 620 may correspond to given type of media asset (e.g., movie). The subject matter field 620 may correspond to given type of media asset source (e.g., on-demand source, music channel source, broadcast source, Internet source, etc.). The subject matter field 622 may correspond to multiple or a combination of subject matters (e.g., time of day and music channel).

The database may store the target volume level indicated in the SQL query to target volume level field 630. If the SQL query indicates a given volume threshold to assign to the indicated subject matter, the database may store the given threshold to threshold field 640 for the corresponding subject matter entry 610.

Control circuitry 304 may request user input to indicate a value for the threshold when control circuitry 304 detects the user request to adjust the volume for a media asset with subject matter that has no corresponding entry stored in the target volume level database. Alternatively or in addition, control circuitry 304 may select a threshold value automatically. The threshold may indicate how far or close a current volume level needs to be from the target volume level in order for control circuitry 304 to increase or decrease the volume rate. For example, a high threshold value may cause the volume adjustment rate to be increased only when the current volume level is very far away from the target volume level. Specifically, a high threshold value may only increase the volume adjustment rate when the current volume is more than 40% away from the target volume. A low threshold value may cause the volume adjustment rate to be increased when the current volume level is very close to the target volume level. Specifically, a low threshold value may increase the volume adjustment rate even when the current volume is more than 5% away from the target volume.

At step 560, an average of the selected volume level and the target volume level stored in the associated subject matter database entry is computed. For example, control circuitry 304 may retrieve the target volume level from target volume level field 620. Control circuitry 304 may compute an average between the retrieved value and the currently set value.

At step 570, the stored target volume level value is updated with the computed average volume level for the associated subject matter database entry. For example, control circuitry 304 may store the computed average in target volume level field 620. Specifically, control circuitry 304 may generate an SQL query that indicates subject matter entry 610 and corresponding target value for entry into field 620. The database may receive the SQL query and update field 620 for the corresponding subject matter entry 610.

In some embodiments, control circuitry 304 may dynamically adjust the volume adjustment rate based on subject matter of content being presented. Specifically, control circuitry 304 may set the volume adjustment rate based on a difference between previously stored target volume levels for subject matter and the currently set volume level when compared to a threshold value. Using the dynamically adjusted volume rate, the user may increase or decrease the volume level of a media asset at one rate (e.g., very slowly) when the media asset is showing one subject matter (e.g., a plot segment) and may increase or decrease the volume level of the media asset at a second rate (e.g., very quickly) when the media asset is showing a second subject matter (e.g., a commercial segment). Specifically, while watching the plot segment the user may desire to change the volume slowly but when the commercial segment is showing the user may desire to change the volume quickly (e.g., to reach a low volume level quickly).

Accordingly, control circuitry 304 may automatically set the rate of the volume change that takes place in response to receiving a user selection of volume adjustment keys (e.g., volume up/down keys). In particular, control circuitry 304 may adjust the volume at one rate when the user selects a volume up key when one type of subject matter is shown and control circuitry 304 may adjust the volume at a second rate when the user selects a volume up key when a second type of subject matter is shown.

In some embodiments, control circuitry 304 may adjust the volume level to a previously set value independently of any previously stored threshold values, and, in some cases, without adjusting the volume adjustment rate. In such circumstances, control circuitry 304 may receive a user input that stores a user selected value for a volume level in storage 308. The user may set different values for the volume level based on subject matter, time of day, key combination on an input device, or any other criteria using a suitable graphical user interface. Upon receiving a user request to adjust the volume level (e.g., when a specific key combination is provided, such as a selection of a dedicated volume setting key followed by a selection of a volume up/down key), control circuitry 304 may retrieve a volume level value from storage 308 that has been previously stored based on the key combination and/or subject matter and/or time of day. Control circuitry 304 may automatically set the volume level to the retrieved value skipping over all values between the current value and the value retrieved from storage 308.

For example, a value of 80% may be stored in storage 308 and associated with action genres. The current volume level may be set to 30%. In response to receiving a user selection of a dedicated volume key followed by a volume up key selection, control circuitry 304 may determine that the subject matter of the media asset currently being viewed is action. Accordingly, control circuitry 304 may adjust the volume level to 80% non-gradually so as to skip over all volume levels between 30% and 80%.

In some embodiments, control circuitry 304 may dynamically adjust the volume rate when a request to adjust the volume is received for one subject matter of a media asset and may avoid adjusting the volume rate for another subject matter of the same media asset. For example, control circuitry 304 may receive a user request to adjust volume of the media asset (e.g., reduce the volume level) when the media asset transitions from a plot segment to a commercial segment. Control circuitry 304 may store the current value of the volume level before adjusting the volume level. Control circuitry 304 may retrieve a target volume level for a commercial segment type of subject matter and may compute a volume adjustment rate based on the subject matter. For example, control circuitry 304 may set the volume adjustment rate to a high value because the media asset is in a commercial segment type of subject matter.

After the same media asset transitions from the commercial segment to a plot segment, control circuitry 304 may receive another user request to adjust the volume level (e.g., a request to increase the volume level). Specifically, control circuitry 304 may determine whether the same media asset (e.g., a media asset having the same title or unique identifier) is being presented. In particular, control circuitry 304 may determine whether the media asset changed between the time the plot segment was shown at one volume level and the time the user request to adjust the volume level a second time was received.

In such circumstances, if the media asset did not change or is the same media asset, instead of computing a new volume adjustment rate for the plot segment of the media asset, control circuitry 304 may set the volume level to the volume level that is previously stored in response to receiving the another user request to adjust the volume level. This way the user does not need to wait to return to the volume level, by pressing a volume button multiple times (or holding down the volume button for some long period of time), that was set before the commercial segment started when the plot segment resumes. If the media asset is not the same or changed between the two user requests to adjust the volume levels, control circuitry 304 may compute a new volume adjustment rate based on the subject matter of the new media asset. Control circuitry 304 may gradually adjust the volume based on the newly computed volume adjustment rate.

Figure 7:
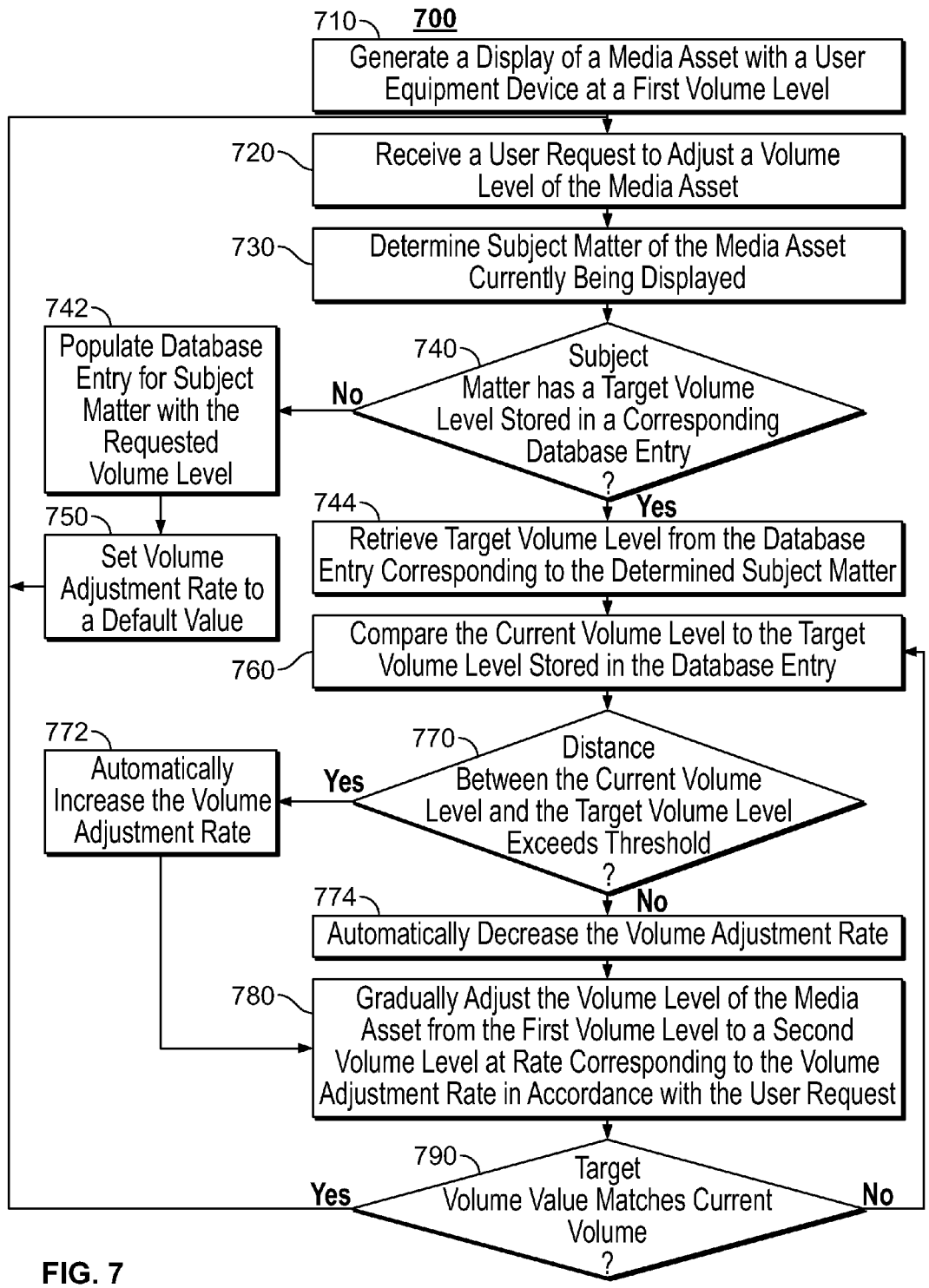
FIG. 7 is a flow diagram describing the process of dynamically adjusting a volume adjustment rate based on media content subject matter in accordance with some embodiments of the disclosure.

FIG. 7 is a flow diagram describing the process 700 of dynamically adjusting a volume adjustment rate based on media content subject matter in accordance with some embodiments of the disclosure. At step 710, a display of a media asset at a first volume level is generated with a user equipment device. For example, control circuitry 304 may receive a media asset from a content source (e.g., a television channel) and the user may set a volume level (e.g., 60%) for watching the media asset.

At step 720, a user request to adjust the volume level of the media asset may be received. This step may be the same or similar as step 510 (FIG. 5). For example, control circuitry 304 may receive a volume up or volume down button selection from the user.

At step 730, subject matter of the media asset currently being displayed may be determined. This step may be performed in the same or similar manner as step 520 (FIG. 5). For example, control circuitry 304 may retrieve a data structure of the media asset being presented from storage 308 to determine the subject matter stored in the data structure.

At step 740, a determination is made as to whether the subject matter has a target volume level stored in a database. In response to determining that the subject matter has a target volume level stored, the process proceeds to step 744, otherwise the process proceeds to step 742. This step may be performed in the same or similar manner as step 540 (FIG. 5).

At step 742, a database entry is populated for the subject matter with the requested volume level. This step may be performed in the same or similar manner as step 550 (FIG. 5).

At step 750, the volume adjustment rate is set to a default value. For example, control circuitry 304 may set the rate at which the volume is adjusted to a pre-defined value stored in storage 308. The pre-defined value may be pre-defined by the user or the system. The pre-defined value may be different for each subject matter.

At step 744, a target volume level is retrieved from the database entry corresponding to the determined subject matter. For example, control circuitry 304 may retrieve the target volume level from target volume level field 620 of the database entry 610 matching the determined subject matter (FIG. 6). Specifically, control circuitry 304 may generate an SQL query to the database that includes the determined subject matter and a request to retrieve field 630 from the entry 610 having field 620 that matches the determined subject matter.

At step 760, the current volume level is compared to the target volume level stored in the database entry. For example, control circuitry 304 may compute a difference between the current volume level and the retrieved target volume level.

At step 770, a determination is made as to whether a distance between the current volume level and the target volume level exceeds a threshold. In response to determining that the distance exceeds the threshold, the process proceeds to step 772, otherwise the process proceeds to step 774. For example, control circuitry 304 may retrieve the threshold value from threshold field 640 of the database entry 610 matching the determined subject matter (FIG. 6). Specifically, control circuitry 304 may generate an SQL query to the database that includes the determined subject matter and a request to retrieve field 640 from the entry 610 having field 620 that matches the determined subject matter. Control circuitry 304 may compare the difference between the current volume level and the target volume level with the retrieved threshold.

At step 772, the volume adjustment rate is automatically increased. For example, the volume adjustment rate may be increased by one volume rate unit. In some implementations, the volume adjustment rate may be increased to a rate associated with the subject matter. In particular, control circuitry 304 may retrieve a volume rate value from a corresponding field of the database entry 610 matching the determined subject matter (FIG. 6). Control circuitry 304 may then set the volume adjustment rate to the retrieved volume rate value.

In some embodiments, the volume adjustment rate may be determined by the number of volume rate units (this may be referred to as the volume chunk size). Each volume rate unit or chunk size may correspond to a given percentage or decibel level of the volume that is to be skipped. The greater the volume rate units included in the volume adjustment rate (or the greater the chunk size) the more percentages or decibels that are skipped when adjusting the volume. For example, a volume adjustment rate that includes three volume rate units may cause the volume to increase/decrease by three percentage values at a time. Accordingly, when a volume up button is pressed once or held for one second, the volume is increased from a level of 10% to 13% skipping over three percentage values. Similarly, when the volume up button is pressed a second time, the volume is increased from a level of 13% to 16% skipping over another three percentage values. When the volume up button is held for two seconds instead of one second, the volume is increased from a level of 10% to 16% skipping over six percentage values.

The volume down button operates in a similar manner but in the opposite direction. Specifically, When a volume down button is pressed once or held for one second, the volume is decreased from a level of 10% to 7% skipping over three percentage values. In some embodiments, a volume adjustment rate that includes ten volume rate units may cause the volume to increase/decrease by ten percentage values at a time. Accordingly, when a volume up button is pressed once or held for one second, the volume is increased from a level of 10% to 20% skipping over ten percentage values. Similarly, when a volume down button is pressed once or held for one second, the volume is decreased from a level of 10% to 0% skipping over ten percentage values.

At step 774, the volume adjustment rate is automatically decreased. For example, the volume adjustment rate may be decreased by one volume rate unit. In some implementations, the volume adjustment rate may be decreased to a rate associated with the subject matter. In particular, control circuitry 304 may retrieve a volume rate value from a corresponding field of the database entry 610 matching the determined subject matter (FIG. 6). Control circuitry 304 may then set the volume adjustment rate to the retrieved volume rate value.

In some implementations, instead of automatically decreasing the volume adjustment rate, this step may be skipped and the process may proceed to step 780. Specifically, the volume adjustment rate may be set to a default value instead of downwardly modified.

At step 780, the volume level of the media asset is gradually adjusted from the first volume level to a second volume level at a rate corresponding to the volume adjustment rate in accordance with the user request. For example, when a volume down button is pressed once or held for one second and the volume adjustment rate is set to a chunk size of five, the volume is decreased from a level of 30% to 25% skipping over five percentage values. When the volume down button is pressed again, the volume is decreased from a level of 25% to 20% skipping over another five percentage values.

At step 790, a determination is made as to whether the target volume level matches the new current volume level. In response to determining that the volume levels match, the process proceeds to step 720, otherwise the process proceeds to step 760.

It should be understood that the above steps of the flow diagrams of FIGS. 5 and 7 may be executed or performed in any order or sequence not limited to the order and sequence shown and described in the figures. Also, some of the above steps of the flow diagrams of FIGS. 5 and 7 may be executed or performed substantially simultaneously where appropriate or in parallel to reduce latency and processing times.

The above-described embodiments of the present disclosure are presented for purposes of illustration and not of limitation, and the present disclosure is limited only by the claims which follow.

What is claimed is:

1. A method for adjusting volume, the method comprising:
   generating a presentation of a media asset with a user equipment device at a first volume level;
   receiving a user request to adjust a volume level of the media asset during the presentation of the media asset;
   determining content of the media asset currently being presented;
   retrieving a target volume level based on the content of the media asset;
   determining whether a difference between the first volume level and the target volume level exceeds a threshold;
   automatically setting a volume adjustment rate based on determining whether the difference between the first volume level and the target volume level exceeds the threshold; and
   gradually adjusting the volume level of the media asset from the first volume level to a second volume level at a rate corresponding to the volume adjustment rate in response to receiving the user request.

2. The method of claim 1, wherein automatically setting the volume adjustment rate comprises:
   decreasing the volume adjustment rate in response to determining that the difference is less than the threshold; and
   increasing the volume adjustment rate in response to determining that the difference is greater than the threshold.

3. The method of claim 2, wherein in response to receiving a first user selection of the volume adjust key, the volume level is adjusted from the first volume level to a third volume level that is between the first volume level and the second volume level, and wherein a distance between the first volume level and the third volume level is determined based on the volume adjustment rate.

4. The method of claim 1, wherein the volume adjustment rate determines by how much to adjust a currently set volume level to another volume level in response to receiving the user request based on the first volume level.

5. The method of claim 1, wherein determining the content comprises:
   processing at least one keyword in closed-caption information received with the media asset and an image currently being displayed; and
   cross-referencing at least one of a database of keywords associated with different content and a database of images associated with different content to determine the content.

6. The method of claim 1, wherein the user request is a first user request to decrease the volume level, further comprising:
   storing an indication of the first volume level before adjusting the volume level;
   receiving a second user request to increase the volume level;
   determining whether the media asset changed before receiving the second user request; and
   in response to determining the media asset has not changed, automatically setting the volume level to the first volume level based on the stored indication and the second user request.

7. The method of claim 6 further comprising in response to determining the media asset has changed to a new media asset:
  automatically setting the volume adjustment rate to a new volume adjustment rate based on new content of the new media asset; and
  gradually adjusting the volume level of the media asset from the second volume level to a third volume level at a rate corresponding to the new volume adjustment rate based on the second user request.

8. The method of claim 1 further comprising generating a database of volume adjustment rates associated with different content.

9. The method of claim 8, wherein the database is generated based on user inputs assigning the different content to volume adjustment rates.

10. The method of claim 8 further comprising:
  monitoring volume levels set by a user for the different content; and
  automatically populating the database based on the monitored volume levels.

11. A system for adjusting volume, the system comprising:
  control circuitry configured to:
    generate a presentation of a media asset with a user equipment device at a first volume level;
    receive a user request to adjust a volume level of the media asset during the presentation of the media asset;
    determine content of the media asset currently being presented;
    retrieve a target volume level based on the content of the media asset;
    determine whether a difference between the first volume level and the target volume level exceeds a threshold;
    automatically set a volume adjustment rate based on determining whether the difference between the first volume level and the target volume level exceeds the threshold; and
    gradually adjust the volume level of the media asset from the first volume level to a second volume level at a rate corresponding to the volume adjustment rate in response to receiving the user request.

12. The system of claim 11, wherein the control circuitry is further configured to:
  decrease the volume adjustment rate in response to determining that the difference is less than the threshold; and
  increase the volume adjustment rate in response to determining that the difference is greater than the threshold.

13. The system of claim 12, wherein in response to receiving a first user selection of the volume adjust key, the volume level is adjusted from the first volume level to a third volume level that is between the first volume level and the second volume level, and wherein a distance between the first volume level and the third volume level is determined based on the volume adjustment rate.

14. The system of claim 11, wherein the volume adjustment rate determines by how much to adjust a currently set volume level to another volume level in response to receiving the user request based on the first volume level.

15. The system of claim 11, wherein the control circuitry is further configured to:
  process at least one keyword in closed-caption information received with the media asset and an image currently being displayed; and
  cross-reference at least one of a database of keywords associated with different content and a database of images associated with different content to determine the content.

16. The system of claim 11, wherein the user request is a first user request to decrease the volume level, and wherein the control circuitry is further configured to:
  store an indication of the first volume level before adjusting the volume level;
  receive a second user request to increase the volume level;
  determine whether the media asset changed before receiving the second user request; and
  in response to determining the media asset has not changed, automatically set the volume level to the first volume level based on the stored indication and the second user request.

17. The system of claim 16, wherein the control circuitry is further configured to, in response to determining the media asset has changed to a new media asset:
  automatically set the volume adjustment rate to a new volume adjustment rate based on new content of the new media asset; and
  gradually adjust the volume level of the media asset from the second volume level to a third volume level at a rate corresponding to the new volume adjustment rate based on the second user request.

18. The system of claim 11, wherein the control circuitry is further configured to generate a database of volume adjustment rates associated with different content.

19. The system of claim 18, wherein the database is generated based on user inputs assigning the different content to volume adjustment rates.

20. The system of claim 18, wherein the control circuitry is further configured to:
  monitor volume levels set by a user for the different content; and
  automatically populate the database based on the monitored volume levels.

* * * * *